Figure 1:
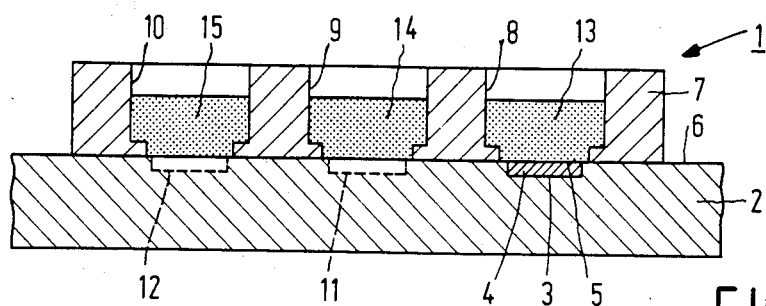

United States Patent [19]

van Oirschot

[11] Patent Number: 4,629,519
[45] Date of Patent: Dec. 16, 1986

[54] FORMING MAGNESIUM-DOPED GROUP III-V SEMICONDUCTOR LAYERS BY LIQUID PHASE EPITAXY

[75] Inventor: Theodorus G. J. van Oirschot, Eindhoven, Netherlands

[73] Assignee: U.S. Philips Corporation, New York, N.Y.

[21] Appl. No.: 781,372

[22] Filed: Sep. 30, 1985

[30] Foreign Application Priority Data

Oct. 4, 1984 [NL] Netherlands ............ 8403017

[51] Int. Cl.[4] .................................. H01L 21/208
[52] U.S. Cl. ............................ 148/171; 148/172; 29/569 L
[58] Field of Search .......... 148/171, 172; 29/569 L

[56] References Cited

U.S. PATENT DOCUMENTS

| | | | |
|---|---|---|---|
| 3,530,015 | 9/1970 | Antell | 148/187 X |
| 3,617,820 | 11/1971 | Herzog | 148/186 X |
| 3,940,296 | 2/1976 | van Oirschot et al. | 148/171 |
| 4,051,061 | 9/1977 | Bhargara et al. | 148/171 X |
| 4,052,252 | 10/1977 | Lockwood et al. | 148/172 X |
| 4,126,930 | 11/1978 | Moon | 148/171 X |
| 4,400,221 | 8/1983 | Rahilly | 148/171 X |

*Primary Examiner*—George T. Ozaki
*Attorney, Agent, or Firm*—Norman N. Spain

[57] ABSTRACT

A method of manufacturing a semiconductor device, in which an epitaxial layer doped with magnesium compounds of elements from the groups III and V of the periodic system of elements is deposited on a surface of a semiconductor body. For this purpose, the semiconductor body is brought into contact with a saturated solution of the compound, in which magnesium is present. Magnesium is added to the solution in the form of magnesium silicide, magnesium germanide or magnesium stannide. Thus, the epitaxial layer can be doped in a very reproducible manner, while moreover defects in the layer due to magnesium oxide particles are prevented.

3 Claims, 3 Drawing Figures

FORMING MAGNESIUM-DOPED GROUP III-V SEMICONDUCTOR LAYERS BY LIQUID PHASE EPITAXY

The invention relates to a method of manufacturing a semiconductor device, in which an epitaxial layer of a compound of elements from the groups III and V of the periodic system of elements doped with magnesium is deposited on a surface of a semiconductor body by bringing the surface into contact with a saturated solution of the compound, which solution contains magnesium.

Such a method is particularly suitable for the manufacture of light-emitting diodes and diode lasers. When the epitaxial layer of the compound of elements from the groups III and V of the periodic system of elements is doped with magnesium, a higly doped p-conducting layer can be formed.

U.S. Pat. No. 4,126,930 discloses a method of the kind mentioned in the opening paragraph.

A difficulty involved in carrying out the known method is that magnesium cannot be readily introduced in a reproducible manner into a solution of compounds of elements from the groups II and V of the periodic system of elements. Due to the high affinity of magnesium to oxygen, a large and unpredictable part of a weighed quantity of magnesium will be converted during heating and melting of the constituents of the solution into insoluble magnesium oxides so that only an unpredictable part of the magnesium is incorporated in the solution as elementary magnesium. The results in that the extent of doping of the epitaxial layer to be grown can be realized only in a very unpredictable manner. Moreover, magnesium oxide particles can seriously disturb the growth of the epitaxial layer so that large defects can occur in this layer.

The invention has inter alia for its object to provide a method by which it is possible to deposit an epitaxial layer doped with magnesium on a substrate, the quantity of magnesium in the layer being accurately predictable and the layer substantially not containing magnesium oxide particles.

The invention is based on the recognition of the fact that it is possible for magnesium to be added to the solution of the compounds of elements from the groups III and V of the periodic system of elements in a manner such that the formation of magnesium oxides is counteracted.

For this purpose, according to the invention, the method of the kind mentioned in the opening paragraph is characterized in that magnesium is added to the solution in the form of a compound from the group of compounds consisting of magnesium silicide, magnesium germanide and magnesium stannide. These magnesium compounds have such a stability that they are not decomposed during heating of the constituents and the formation of the solution. When incorporated in solution, these compounds are dissociated and a part of the magnesium thus formed can be incorporated in the epitaxial layer. This part is proportional to the quantity of the magnesium compound which is added to the constituents for the solution so that it can be previously accurately determined. Thus, it is achieved that the extent of doping of the epitaxially grown layer can be previously and accurately determined. Magnesium oxides are substantially not present in the solution. The element germanium, silicon or tin, which will be present in the saturated solution of the compound to be epitaxially deposited with the use of one of the said magnesium compounds, cannot be readily dissolved in the compound to be deposited and moreover is not very active as a doping element. For this reason, the doping with magnesium will substantially not be influenced by germanium, silicon or tin.

Preferably, the compound of elements from the groups III and V of the periodic system of elements comprises aluminum, gallium and arsenic. In this case, solutions are formed at a temperature of about 800° C., at which temperature these magnesium compounds are still very stable so that magnesium oxides are practically not formed.

In case the epitaxial layer comprises aluminum, gallium and arsenic, of the said magnesium compounds, magnesium germanide is preferably used because germanium dopes such a layer in the same manner (p-type) as magnesium.

The invention will be described more fully hereinafter, by way of example, with reference to a drawing.

Figure 2:
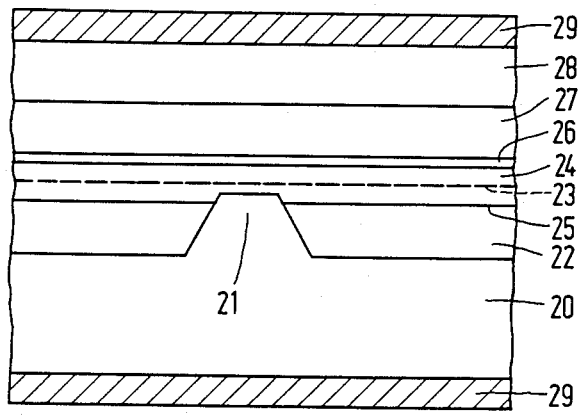
Figure 3:
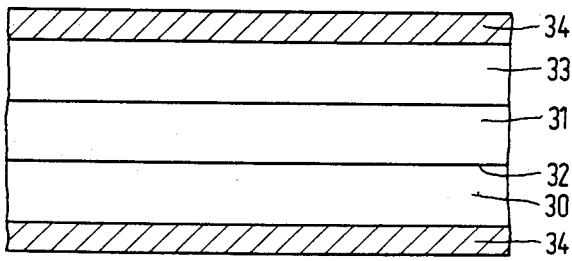

In the drawing:

FIG. 1 shows diagrammatically a part of an arrangement for carrying out the method according to the invention, FIG. 2 shows diagrammatically a laser diode manufactured by means of the method according to the invention, and FIG. 3 shows diagrammatically a photodiode manufactured by means of the method according to the invention.

FIG. 1 shows a part 1 of an arrangement for carrying out the method according to the invention. The part 1 shown comprises a carbon base 2 with a cavity 3, in which a semiconductor body 4 with a flat surface 5 can be arranged. The carbon base 2 is provided with a flat surface 6, on which a supporting member 7 also made of carbon is placed, which is provided in this embodiment with three recesses 8, 9 and 10 for accommodating a solution from which a layer can be epitaxially deposited on the semiconductor body 4. The situation is shown in which the semiconductor body 4 is in contact with the solution in the recess 8. By a relative displacement of the carbon base 2 and the supporting member 7, the semiconductor body 4 can be brought into contact with solutions in the recesses 9 and 10, as indicated diagrammatically by 11 and 12.

During operation, the part 1 shown is arranged in a furnace (not shown), in which it is heated in a suitable gas atmosphere. Constituents of solutions 13, 14 and 15 provided beforehand in the recesses 8, 9 and 10 are then heated so that they melt and form the desired solutions. Subsequently, the whole is caused to be cooled very slowly, the semiconductor body 4 being successively brought into contact with the solutions in the recesses 8, 9 and 10 in the manner described. By a suitable choice of the composition of the solutions, desired epitaxial layers can be deposited on the semiconductor body 4.

The invention is limited to that method of manufacturing a semiconductor device, in which an epitaxial layer doped with magnesium of a compound of elements from the groups III and V of the periodic system of elements is deposited on the surface 5 of the semiconductor body 4 by bringing the surface 5 into contact with a saturated solution of the compound (in one of the recesses 8, 9 or 10), this solution containing magnesium.

A difficulty involved in carrying out this method is that magnesium due to its high affinity to oxygen can be introduced into a solution in a reproducible quantity only with great difficulty. A large and unpredictable part of the magnesium can be converted into insoluble magnesium oxides during heating and melting of the constituents of the solution so that the quantity of dissolved magnesium is also unpredictable. This results in that the extent of doping of the epitaxial layer cannot readily be determined in a predictable manner and that defects can occur in the layer due to magnesium oxide particles.

This problem is obviated by adding according to the invention magnesium to the solution in the form of a compound containing an element from group IV of the periodic system of elements. These compounds are so stable that they are not decomposed during heating of the constituents and formation of the solution and dissociate only in the dissolved state. A predictable part of the magnesium then present in the dissolved state is then incorporated in the epitaxial layer. The extent of doping thereof can then be previously accurately determined. Magnesium oxide particles practically do not occur in the solution either.

FIG. 2 shows diagrammatically a laser diode manufactured by means of the method according to the invention. The starting material is a p-type GaAs substrate 20 with a Zn doping concentration of $1.10^{19}$ atoms per cm$^3$, which is provided with about 2 μm high and about 2 μm wide mesashaped embossed part 21. In an arrangement as shown in FIG. 1, a number of layers are successively epitaxially deposited thereon. First an n-type $Ga_{0.7}Al_{0.3}As$ layer 22 is deposited, which is doped with Te up to a doping concentration of $1.10^{18}$ atoms per cm$^3$. This layer extends as far as above the embossed part 21, as indicated diagrammatically by a dotted line 23.

Subsequently, about a 1 μm thick p-type $Ga_{0.5}Al_{0.5}As$ layer 24 is deposited which layer is doped by means of the method according to the invention with Mg with a doping concentration of $3.10^{18}$ atoms per cm$^3$. For this purpose, in an arrangement as shown in FIG. 1, one of the recesses (8, 9 and 10) is filled with 5 g of Ga, 90 mg of GaAs, 5 mg of Al and 5 mg of Mg$_2$Ge. These constituents are heated to a temperature of about 800° C., a solution being formed and then being cooled to 760° C., the desired saturated solution being formed and the solution then being brought into contact with the layer 22. During further cooling by about 0.5° C./min, the layer 24 is formed, while the desired composition and the desired doping are obtained. Thus, the doping is effected in a very reproducible manner. Furthermore, in a usual manner, about 0.1 μm thick undoped layer 26 of $Ga_{0.85}Al_{0.15}As$, about 1.5 μm thick n-type layer 27 of $Ga_{0.5}Al_{0.5}As$ doped with Te with a doping concentration of $3.10^{18}$ atoms per cm$^3$ and about 5μm thick n-type top layer 28 of GaAs doped with Te with a doping concentration of $2.10^{18}$ atoms per cm$^3$ are now deposited in the arrangement shown in FIG. 1. After termination of the growth, the substrate 20 with the layers 22-28 is heated for about 5 minutes to about 800° C., Mg diffusing from the layer 24 into the layer 22. Thus, a p-n junction indicated by the line 25 is formed. The p-n junction 25 intersects the embossed part 21 so that at the area of the embossed part 21 a strip-shaped contact is obtained between the p-type substrate 20 and the p-type layer 24. After contact electrodes 29 have been provided, the substrate is cleaved in the usual manner and the laser diodes formed can further be finished. The reproducibility of the doping with magnesium appears from the fact that, when the method described is used several times, the p-n junction 25 terminated within 0.2 μm invariably at the same area with respect to the embossed part 21.

FIG. 3 shows diagrammatically a light-emitting diode manufactured by means of the method according to the invention. The starting material is a p-type GaAs substrate 30 doped with Zn with a doping concentration of $4.10^{18}$ atoms per cm$^3$.

In an arrangement as shown in FIG. 1, a p-type $Ga_{0.65}Al_{0.35}As$ layer 31 doped with Mg with a doping concentration of $5.10^{17}$ atoms per cm$^3$ is deposited on the substrate 30. For this purpose, one of the recesses (8, 9, 10) is filled with 5 g of Ga, 110 mg of GaAs, 3.5 mg of Al and 0.1 mg of Mg$_2$Ge. These constituents are heated to a temperature of 800° C., a solution being formed, which is then cooled to 760° C., the desired saturated solution being obtained. The solution is now brought into contact with the substrate 30, whereupon during further cooling by about 0.5° C./min the layer 31 is formed. The reproducibility of the doping with magnesium appears in this case from the fact that the efficiencies of the diodes manufactured in this manner were equal to each other within 20%.

Subsequently, in a usual manner, an n-type layer 33 of $Ga_{0.35}Al_{0.65}As$ doped with Te with a concentration of $2.10^{17}$ atoms per cm$^3$ is deposited and the p-n junction 32 is formed in an arrangement as shown in FIG. 1. After electrodes 34 have been provided and the whole has been cleaved, the photodiodes thus formed can be further finished in a usual manner.

In the embodiments, magnesium germanide is mentioned as magnesium compound. Magnesium silicide and magnesium stannide are also compounds which remain stable during heating and melting of the constituents of the solution of the compounds of elements from group III and V of the periodic system of elements and dissociate only in the dissolved state. Also with these compounds, magnesium can be incorporated in an epitaxial layer in a predictable and reproducible manner. The said magnesium compounds are particularly suitable for use in the method according to the invention if the elements from groups III and V of the periodic system of elements in the epitaxial layer are aluminum, gallium and arsenic. However, magnesium germanide is then preferably used because this compound dopes an $Al_xGa_{1-x}As$ layer in the same manner as magnesium.

What is claimed is:

1. A method of manufacturing a semiconductor device, in which a magnesium doped epitaxial layer of a compound of elements from the group II and group V of the periodic table of elements is deposited on a surface of a semiconductor body by bringing said surface into contact with a saturated solution of said compound and magnesium, characterized in that the magnesium is added to the solution in the form of a compound selected from the group consisting of magnesium silicide, magnesium germanide and magnesium stannide.

2. A method as claimed in claim 1, characterized in that the compound of elements from the groups III and V of the periodic system of elements consists of aluminum, gallium and arsenic.

3. A method as claimed in claim 2, characterized in that as the magnesium compound magnesium germanide is used.

* * * * *